United States Patent
Vanderberg

(10) Patent No.: US 9,443,698 B2
(45) Date of Patent: Sep. 13, 2016

(54) HYBRID SCANNING FOR ION IMPLANTATION

(75) Inventor: Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1043 days.

(21) Appl. No.: 12/245,866

(22) Filed: Oct. 6, 2008

(65) Prior Publication Data

US 2010/0084576 A1 Apr. 8, 2010

(51) Int. Cl.
*H01J 37/04* (2006.01)
*H01J 37/317* (2006.01)
*H01J 37/147* (2006.01)

(52) U.S. Cl.
CPC ........ *H01J 37/3171* (2013.01); *H01J 37/1474* (2013.01); *H01J 2237/1508* (2013.01); *H01J 2237/30483* (2013.01)

(58) Field of Classification Search
None
See application file for complete search history.

(56) References Cited

U.S. PATENT DOCUMENTS

| | | | | |
|---|---|---|---|---|
| 4,697,086 A | * | 9/1987 | Ishitani | H01J 37/05 250/396 R |
| 4,959,544 A | * | 9/1990 | Sukenobu | H01J 49/48 250/305 |
| 5,063,294 A | * | 11/1991 | Kawata | H01J 37/256 250/397 |
| 5,386,115 A | * | 1/1995 | Freidhoff | H01J 49/288 250/281 |
| 5,530,244 A | * | 6/1996 | Sriram | H01J 49/288 250/281 |
| 5,536,939 A | * | 7/1996 | Freidhoff | H01J 49/288 250/281 |
| 5,672,879 A | * | 9/1997 | Glavish | H01J 37/1475 250/396 ML |
| 5,907,158 A | * | 5/1999 | Nasser-Ghodsi | H01J 37/3171 250/423 R |
| 6,143,628 A | * | 11/2000 | Sato | H01L 21/2007 257/E21.122 |
| 6,313,474 B1 | * | 11/2001 | Iwasawa | H01J 37/3171 250/397 |
| 6,639,227 B1 | * | 10/2003 | Glavish | H01J 37/05 250/296 |
| 6,881,966 B2 | | 4/2005 | Benveniste et al. | |
| 7,019,314 B1 | * | 3/2006 | Benveniste | H01J 37/3171 250/290 |
| 7,102,146 B2 | | 9/2006 | Rathmell | |
| 2003/0001110 A1 | * | 1/2003 | Enge | H01J 37/1474 250/492.21 |
| 2004/0227105 A1 | * | 11/2004 | Benveniste | H01J 37/05 250/492.21 |
| 2005/0045821 A1 | * | 3/2005 | Noji | G01N 23/225 250/311 |
| 2005/0092921 A1 | * | 5/2005 | Nakasuji | G01N 23/225 250/306 |
| 2005/0269526 A1 | * | 12/2005 | Rathmell | H01J 37/3171 250/492.21 |
| 2008/0087842 A1 | * | 4/2008 | Sakurai | H01J 27/205 250/423 R |

* cited by examiner

Primary Examiner — Andrew Smyth
(74) Attorney, Agent, or Firm — Eschweiler & Associates, LLC

(57) ABSTRACT

A hybrid scanner is disclosed that is capable of performing at least one of an electric and magnetic scanning of an ion beam. The hybrid scanner comprises a plurality of magnetic elements configured to generate a magnetic field across the ion beam for magnetic scanning, and a plurality of electric elements configured to generate an electric field proximate to the ion beam for electric scanning. A power delivery controller is coupled to at least one of the magnetic elements and at least one of the electric elements, and is configured to selectively provide power to the magnetic and electric elements.

22 Claims, 7 Drawing Sheets

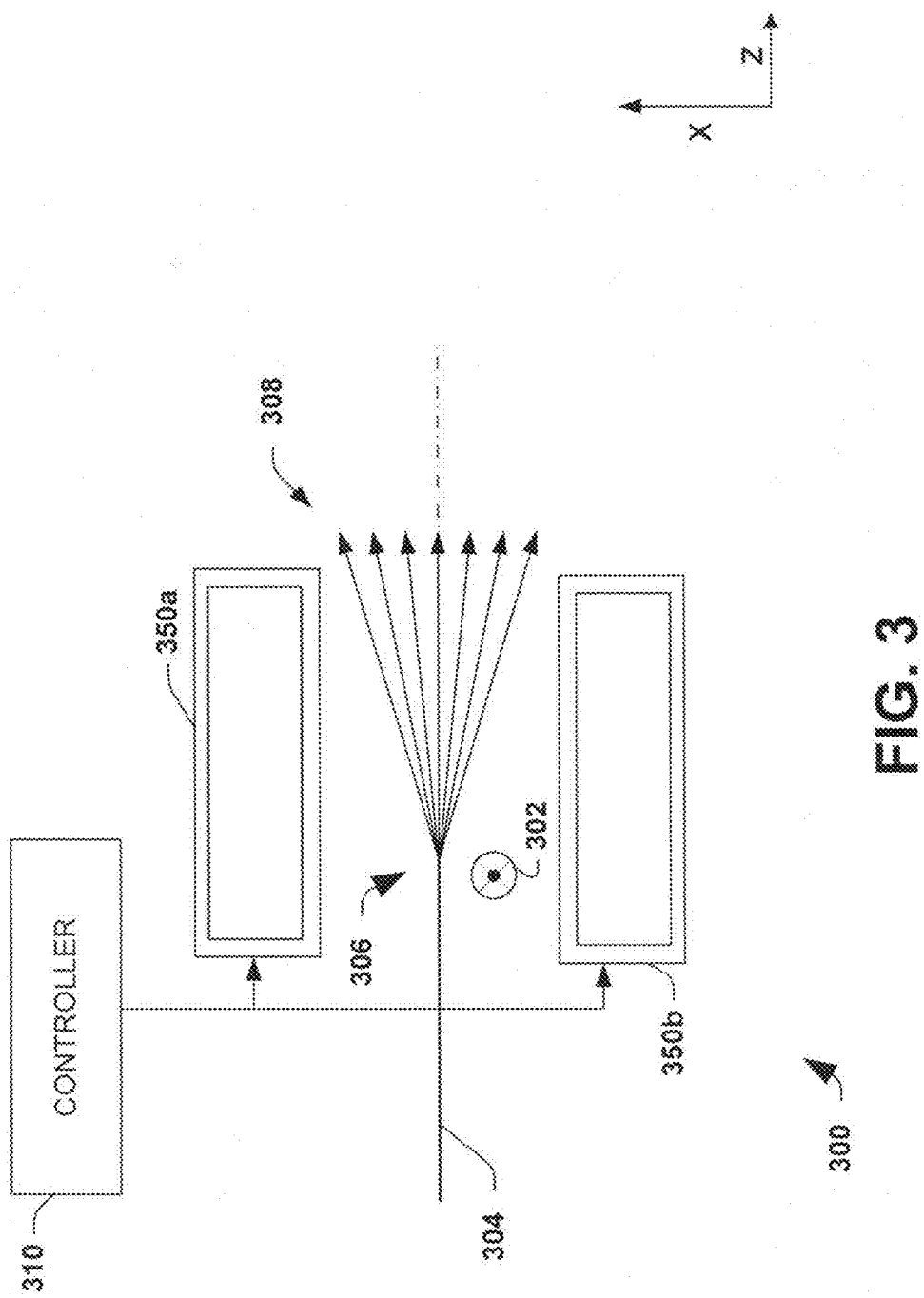

HYBRID SCANNING FOR ION IMPLANTATION

FIELD

The present disclosure relates generally to ion implantation systems, and more specifically to ion beam scanning systems and methods.

BACKGROUND

Ion implanters are advantageous because they allow for precision with regard to the quantity or concentration of dopants implanted into a workpiece, as well as to the placement of dopants within the workpiece. In particular, ion implanters allow the dose and energy of implanted ions to be varied for given applications. Ion dose controls the concentration of implanted ions, where high current implanters are typically used for high dose implants, and medium current implanters are used for lower dose applications. Ion energy is used to control the junction depth or the depth to which ions are implanted into a semiconductor workpiece.

It can be appreciated that given the trend in the electronics industry to scale down electronic devices to produce smaller, yet more powerful devices (e.g., cell phones, digital cameras, etc.), that the semiconductors and integrated circuits (e.g., transistors, etc.) utilized in these devices are continually being reduced in size. The ability to "pack" more of these devices onto a single semiconductor substrate, or portion thereof (known as a die) also improves fabrication efficiency and yield. It can be appreciated that reducing the energy of the ion beam may allow implants to be performed to shallower depths to produce thinner devices and enhance packing densities. It can also be appreciated that increasing the dose in shallower implants can facilitate desired conductivity, and that beam current of lower energy ion beams may have to increase to facilitate increased packing densities. In other instances, it may be desirable to use a higher energy beam to selectively implant ions relatively deeply into the substrate, so as to create volumes with varying semiconducting properties (e.g., diodes) and/or to tailor the field distribution between different regions or devices in the substrate. Presently different tools (e.g., medium current vs. high current implanters) are used for these different applications.

It can be appreciated that it would be desirable at least for economic reasons to have a single ion implantation system perform a wide range of ion implants in various manners. One form of scanning is electric scanning, wherein a voltage is applied across two electrodes to create an electric field that diverts or alters the path of the ion beam. Electric scanning can generally be performed with low power requirements, but may cause the beam to suffer from space-charge effects. Another form of ion beam scanning is magnetic scanning, wherein a magnetic field is generated through which the ion beam passes that diverts or alters the path of the ion beam. The magnetic scanner may be more costly, but does not suffer from the space-charge blow-up resulting from electric fields. Accordingly, there is a need to provide an arrangement that allows the benefits of both an electric scanner and a magnetic scanner.

SUMMARY

The following presents a simplified summary of the disclosure in order to provide a basic understanding of some aspects of the disclosure. This summary is not an extensive overview of the disclosure, and is neither intended to identify key or critical elements nor to delineate the scope of the disclosure. Rather, the purpose of the summary is to present some concepts in a simplified form as a prelude to the more detailed description that is presented later.

The present disclosure suggests an ion implantation system that features a hybrid electric/magnetic scanner. The hybrid scanner can employ an electric scanning for some ion beams, a magnetic scanning for other beams, as well as both types of scanning in order to confer the benefits of both scanning technologies.

The following description and annexed drawings set forth in detail certain illustrative aspects and/or implementations of the disclosure. These are indicative of but a few of the various ways in which the principles of the disclosure may be employed.

BRIEF DESCRIPTION OF THE DRAWINGS

FIG. 3 illustrates a diagram of magnetic scanning of a hybrid scanner.

DETAILED DESCRIPTION

Figure 1:
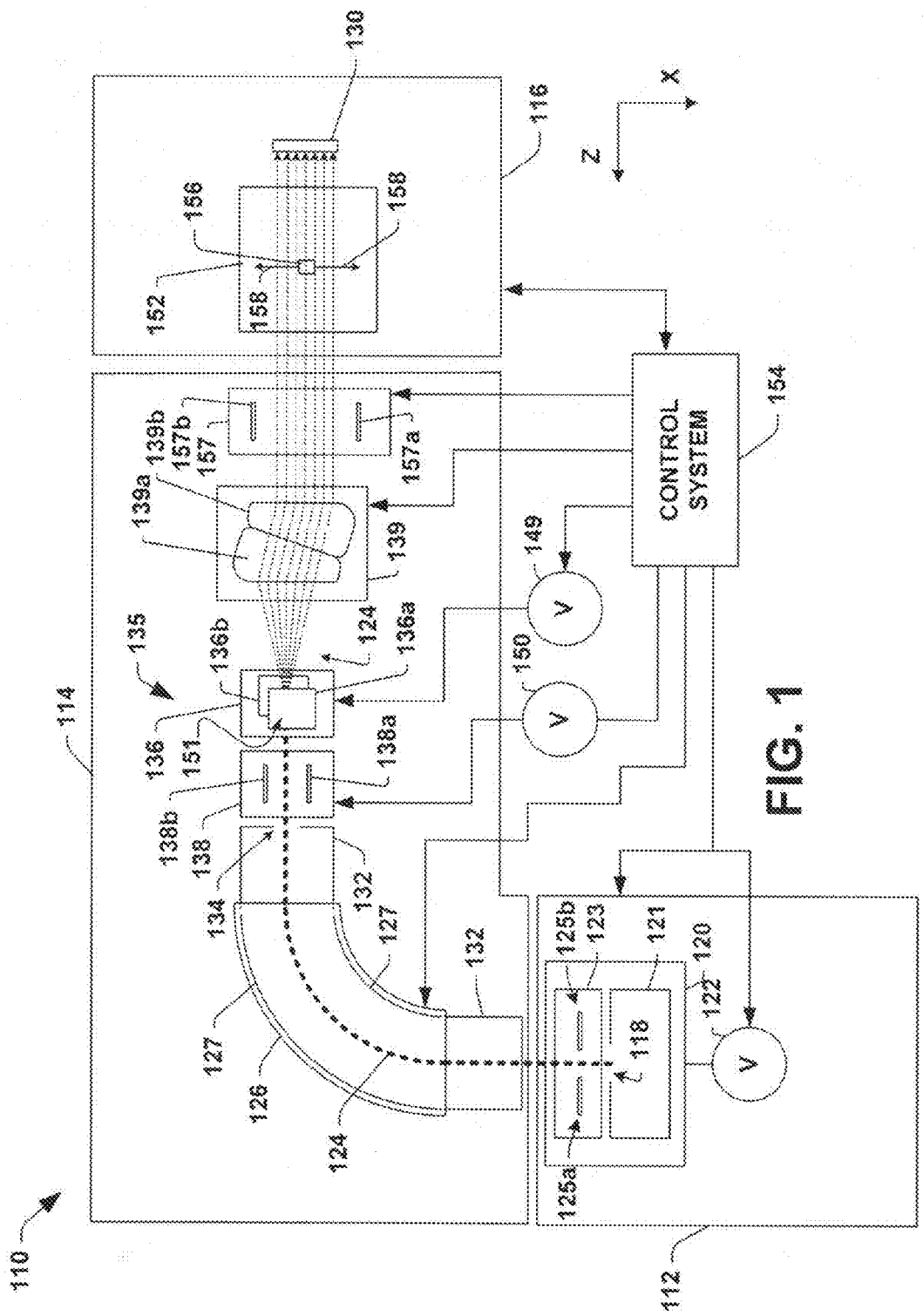
FIG. 1 illustrates an example ion implantation system.

The present disclosure will now be described with reference to the drawings wherein like reference numerals are used to refer to like elements throughout, and wherein the illustrated structures are not necessarily drawn to scale.

The present disclosure relates to a hybrid scanner capable of performing electric and magnetic scanning of an ion beam, and thus affording some of the advantages of both magnetic and electric scanning systems. The hybrid scanner comprises a plurality of magnetic elements configured to generate a magnetic field proximate to the ion beam, a plurality of electric elements configured to generate an electric field proximate to the ion beam, and a power delivery that together generate a magnetic controller operably coupled to at least one of the magnetic elements and at least one of the electric elements. The controller is configured to select at least one of the magnetic scanning mode and the electric scanning mode for scanning the ion beam, and to provide power to the scanning elements of the at least one selected scanning mode. A hybrid scanner configured in this manner may be operated to electrically scan an ion beam by providing power to the electric scanning elements, and to magnetically scan an ion beam by providing power to the magnetic scanning elements.

Electric scanners are not very costly and consume relatively little power. Therefore, under certain conditions electric scanners can provide various advantages. At low energies an electric scanner can cause space-charge blow-up and thereby potentially limit the amount of beam transmission that can be delivered. Beam blow-up is the increase of transverse velocity of a beam with distance along the beam path or axis, and space-charge blow-up is beam blow-up caused by beam-internal space-charge forces, which are proportional to a beam characteristic known in the art as perveance. During ion beam drift in electric field free regions, the ion beam attracts electrons generated from ionizing collisions with background gas(es) or from secondary electron emission from collisions with aperture defining materials, for example, a process referred to as self-neutralization. Electric fields of the electric scanner remove the electrons from self-neutralization and cause the beam within the scanner to blow-up, which can result in a beam envelope unmanageably large and thus beam current loss. Hence, electric scanners are generally used to scan medium-energy ion beams, such as ion beams having energy greater than about 5 keV but less than 500 keV, for example.

Magnetic scanning is another method of scanning wherein a magnetic field is generated through which the ion beam passes. The magnetic field diverts or alters the path of the ion beam such that the ion beam appears to originate from a vertex point over time. The magnetic scanner does not readily suffer from space-charge blow-up resulting from electric fields. As a result, using a magnetic scanner can permit high beam currents to be obtained. Magnetic scanners have relatively larger power requirements when compared to electric scanners and can thus be more costly. Accordingly, magnetic scanners can be used at higher energies, when the voltages used by electric scanning would be excessive, or at low energies, where electric based scanners could have substantial amounts of beam blow-up, which reduces beam current. However, power requirements from resistive coil losses and the like can limit the use of magnetic based scanners for high current, medium energy ion beams to around 60 keV maximum energy of Arsenic ion beams, for example.

The hybrid scanner described herein may be utilized as a scanner in an ion implantation system capable of providing both electric and magnetic scanning for ion beams generated thereby. The benefits of both scanning methods may be obtained in combination or individually from each method. Accordingly, the present disclosure relates to a system for implanting ions in a workpiece, comprising an ion source configured to generate an ion beam, a hybrid scanner configured to generate a magnetic scanning field proximate to the ion beam for a magnetic scanning mode, and an electric scanning field proximate to the ion beam for an electric scanning mode. Additionally, an end station can be configured to support a workpiece in the path of the ion beam.

FIG. 1 illustrates an exemplary ion implantation system 110 in accordance with an aspect of the present disclosure. The system 110 is presented for illustrative purposes, and the present disclosure is not limited to the particulars of this exemplary ion implantation system; it will be appreciated that other suitable ion implantation systems can also be employed in accordance with the present disclosure.

The exemplary ion implantation system 110 illustrated in FIG. 1 comprises a terminal 112, a beamline assembly 114, and an end station 116. The terminal 112 comprises an ion source 120 powered by a high voltage power supply 122 that produces and directs an ion beam 124 to the beamline assembly 114. The ion source 120 generates charged ions that are extracted therefrom and formed into the ion beam 124, which is directed along a beam path in the beamline assembly 114 to the end station 116.

To generate the ions, a gas of a dopant material (not shown) to be ionized is introduced within a generation chamber 121 of the ion source 120. The dopant gas may, for example, be fed into the chamber 121 from a gas source (not shown). In addition or alternative to the power supply 122, it will be appreciated that any number of suitable mechanisms (none of which are shown) may be used to excite free electrons within the ion generation chamber 121, such as RF or microwave excitation sources, electron beam injection sources, electromagnetic sources, and/or a cathode that creates an arc discharge within the chamber. The excited electrons collide with the dopant gas molecules and thereby generate ions of the dopant. Typically, positive ions are generated, although the present disclosure is applicable to systems wherein negative ions are alternatively or additionally generated.

In the exemplary ion implantation system illustrated in FIG. 1, the ions generated from the gas source are controllably extracted through a slit 118 in the chamber 121 by an ion extraction assembly 123. The ion extraction assembly 123 comprises a plurality of extraction and/or suppression electrodes 125a, 125b. The extraction assembly 123 can comprise, for example, a separate extraction power supply (not shown) configured to bias the extraction and/or suppression electrodes 125a, 125b in order to accelerate the ions from the generation chamber 121. Since the ion beam 124 often comprises like-charged particles, the beam may have a tendency to blow-up or expand radially outward, as the like-charged particles repel one another. Beam blow-up may be exacerbated in low energy, high current (high perveance), beams where many like-charged particles are moving in the same direction relatively slowly, thereby imparting an abundance of repulsive forces among the particles that have less momentum to maintain movement in the direction of the beam path. In order to reduce beam blow-up, the extraction assembly 123 may be configured to extract the beam at a high energy, in which the particles have sufficient momentum to overcome repulsive forces.

In the exemplary ion implantation system 110 of FIG. 1, the beamline assembly 114 comprises a beamguide 132, a mass analyzer 126, a scanning system 135, and a parallelizer 139. The mass analyzer 126 of this exemplary ion implantation system 110 is structurally configured with about a ninety degree angle, and comprises one or more magnets (not shown) that together establish a (dipole) magnetic field therein. As the ion beam 124 enters the mass analyzer 126, it is correspondingly deflected by the magnetic field, such that ions having too great or too small a charge-to-mass ratio are deflected into side walls 127 of the mass analyzer 126. In this manner, the mass analyzer 126 selectively filters the ions in the beam 124 and passes therethrough only the ions having the desired charge-to-mass ratio. Because ion beam collisions with other particles in the system 110 may degrade beam integrity, the beamguide 132 and/or mass analyzer 126 may be evacuated through the inclusion of one or more pumps (not shown.)

In one embodiment, the scanning system 135 can be a hybrid scanning system 135 capable of performing magnetic and electric scanning of the ion beam 124. The scanning system 135 may therefore provide the benefits characteristic of both electric and magnetic scanning. In this example, the scanning system 135 generates an electric field for scanning medium- and/or high-energy ion beams, and generates a magnetic field for scanning low-energy ion beams, such as beams below or at about 5 keV, for example. The exemplary scanning system 135 comprises magnetic/electric scanning elements 136 and a focusing and/or steering element 138. Respective power supplies 149, 150 are coupled to the magnetic/electric scanning elements 136 and the focusing and steering element 138, and more particularly to respective pieces 136a, 136b and electrodes 138a, 138b located therein.

In the exemplary system 110 of FIG. 1, the ion beam 124 that is provided to the focusing and steering element 138 has a relatively narrow profile (e.g., a "pencil" beam in the illustrated system 110.) A voltage applied by the power supply 150 to the electrodes 138a and 138b operates to focus and steer the beam to the scan vertex 151 of the scanning element 136. The scanning system power supply 149 (which may also comprise the power supply for the focusing and steering element 150) applies a voltage waveform to the pole pieces 136a and 136b and thereby scans the beam 124 back and forth, in this example. The scan vertex 151 may be defined as the point in the optical path from which each beamlet or scanned part of the ribbon beam appears to originate after having been scanned by the scanning element 136.

In the exemplary ion implantation system 110 of FIG. 1, the scanned beam 124 is passed through the parallelizer 139 that is configured to receive the ion beam and redirect the ions of the ion beam in a substantially parallel direction. In this exemplary system, the parallelizer 139 comprises two dipole magnets 139a, 139b that are substantially trapezoidal and oriented to mirror one another with equal angles and radii, and opposite directions of curvature. The parallelizer 139 alters the path of the scanned beam 124 such that the ions of the ion beam 124 travel in a direction substantially parallel to a beam axis, regardless of the scan angle. As a result, the implantation angle is relatively uniform across a workpiece 130.

The exemplary ion implantation system 110 of FIG. 1 also comprises one or more deceleration stages 157 located downstream of the parallelization component 139 that are configured to receive the ion beam and to reduce the energy of the ion beam 124 by decelerating the ions of the ion beam 124. In the exemplary system 110, from the point of generation in the terminal 112 to the one or more deceleration stages 157, the ion beam 124 is transported at a relatively high energy level to mitigate the propensity for beam blow-up, which can be particularly high where beam density is elevated, such as at a resolving aperture 134, for example. The deceleration stage 157 comprises one or more electrodes 157a, 157b configured and positioned as apertures through which the beam travels.

While the exemplary ion implantation system 110 of FIG. 1 comprises electrodes 125a and 125b, 136a and 136b, 138a and 138b, and 157a and 157b for the ion extraction assembly 123, scanning element 136, focusing and steering element 138, and deceleration stage 157, it will be appreciated that that these elements 123, 136, 138 and 157 may comprise any suitable number of electrodes arranged and biased to accelerate and/or decelerate ions, as well as to focus, bend, deflect, converge, diverge, scan, parallelize and/or decontaminate the ion beam 124, such as provided in U.S. Pat. No. 6,777,696 to Rathmell et al. the entirety of which is hereby incorporated herein by reference. Additionally, the focusing and steering element 138 may comprise electrostatic deflection plates (e.g., one or more pairs thereof), an Einzel lens, quadrupoles, and/or other focusing elements to focus the ion beam.

The exemplary ion implantation system 110 of FIG. 1 further comprises an end station 116 configured to support the workpiece 130 in the path of the ion beam 124. Different types of end stations 116 may be employed in the implanter 110. For example, a "batch" type end station may be configured to support multiple workpieces 130 on a rotating support structure, wherein the workpieces 130 are rotated through the path of the ion beam until all of the workpieces 130 are completely implanted. A "serial" type end station, on the other hand, may be configured to support a single workpiece 130 along the beam path for implantation, wherein multiple workpieces 130 are implanted one at a time in serial fashion, with each workpiece 130 being completely implanted before implantation of the next workpiece 130 begins. In hybrid end stations, the workpiece 130 may be mechanically translated in a first (Y or slow scan) direction while the beam is scanned in a second (X or fast scan) direction to impart the beam 124 over the entire workpiece 130. The exemplary ion implantation system 110 of FIG. 1 comprises a "serial" type end station 116 configured to support one workpiece 130 along the beam path for implantation.

The end station 116 may further comprise a dosimetry system 152 near the workpiece configured to provide calibration measurements prior to implantation operations. During calibration, the ion beam 124 passes through dosimetry system 152, which comprises one or more profilers 156 that continuously traverse a profiler path 158, thereby measuring the profile of the scanned beams. The dosimetry system 152 may be configured to measure beam density distribution and/or angular distribution, for example. In the exemplary ion implantation system 110 of FIG. 1, the profiler 156 comprises a current density sensor, such as a Faraday cup, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor is configured to move in a generally orthogonal fashion relative to the scanned beam, and thus traverses the width of the ribbon beam.

Having generally described the components of an exemplary ion implantation system, the present disclosure will next discuss hybrid scanning and various embodiments thereof in greater detail. It will be appreciated that such hybrid scanners may be utilized in ion implantation systems, such as the ion implantation system described hereinabove, in a manner in accordance with the present disclosure.

In one embodiment, the hybrid scanner comprises a plurality of electrodes for producing an electric scanning mode, wherein applying a voltage difference between the electrodes generates an electric field across the ion beam. The voltage between the electrodes is significantly determinative of the strength of the electric field thereby produced; accordingly, the electric field strength may be varied in order to vary the degree of scanning of the ion beam. The hybrid scanner presented herein also comprises a plurality of conductors for producing a magnetic scanning mode in an analogous manner. Passing an electric current through the conductors generates a magnetic field across the ion beam. Again, the current passed through the conductors is significantly determinative of the strength of the magnetic field thereby produced, and the magnetic field strength may be varied in order to vary the degree of scanning of the ion beam.

In some embodiments of this hybrid scanner may also comprise a power delivery controller operably (not shown) coupled with the electric scanning elements and the magnetic scanning elements, and configured to provide power to the elements of the selected scanning mode while withholding power from the elements of the other scanning mode. These and other embodiments (including the embodiment illustrated in FIG. 1) of the ion implantation systems described herein may further comprise a control system 154 operably coupled with the hybrid scanner (e.g., by direct coupling with the electric elements and the magnetic elements, or by operative coupling with a power delivery controller), and configured to select at least one of the electric scanning mode and the magnetic scanning mode in relation to at least one ion beam property, such as beam energy, current, voltage, mass, charge, and/or species. In some such embodiments, the control system 154 is further operably coupled to other components of the ion implantation system, and is configured to adjust the parameters of the ion implantation system in relation to one or more parameters of the ion beam. These and other features of various embodiments in accordance with the present disclosure will be discussed.

Figure 2A:
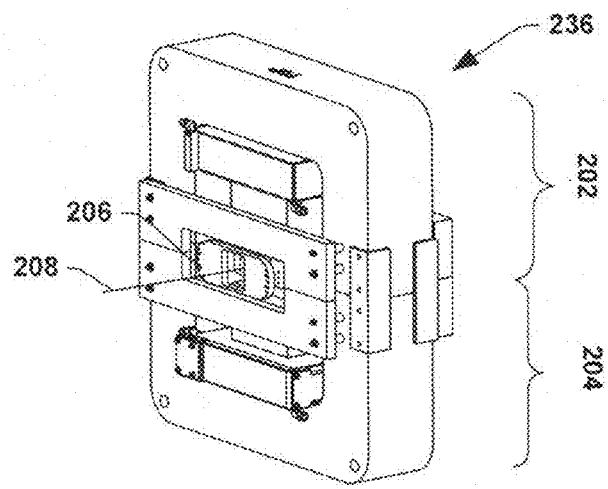
FIG. 2A illustrates an example of a hybrid scanner in accordance with one aspect of the disclosure.

FIG. 2A shows one embodiment of a hybrid scanner 236 that comprises both electric scanning and magnetic scanning components for scanning according to a magnetic and/or an electric scanning mode. The hybrid scanner 236 can also comprise one example of the scanner 136 illustrated in FIG. 1. The scanner 236 comprises an upper half 202 and a lower half 204, which together form an aperture 206 for entrance of a pencil beam 208. Once inside of the scanner 236 the pencil beam 208 can be scanned to provide a scanned pencil beam, sometimes also referred to as a scanned ribbon beam. In addition, in one embodiment, the hybrid scanner could comprise a power control unit (not shown) that effectively controls power to both the electric scanning components and magnetic scanning components as will be discussed further infra. In this case, the power control unit (further discussed infra) can effectively control power to both the electric scanning components and magnetic scanning components of the hybrid scanner 236 to allow for a pencil beam to enter the aperture 206 and exit there through.

Figure 2B:
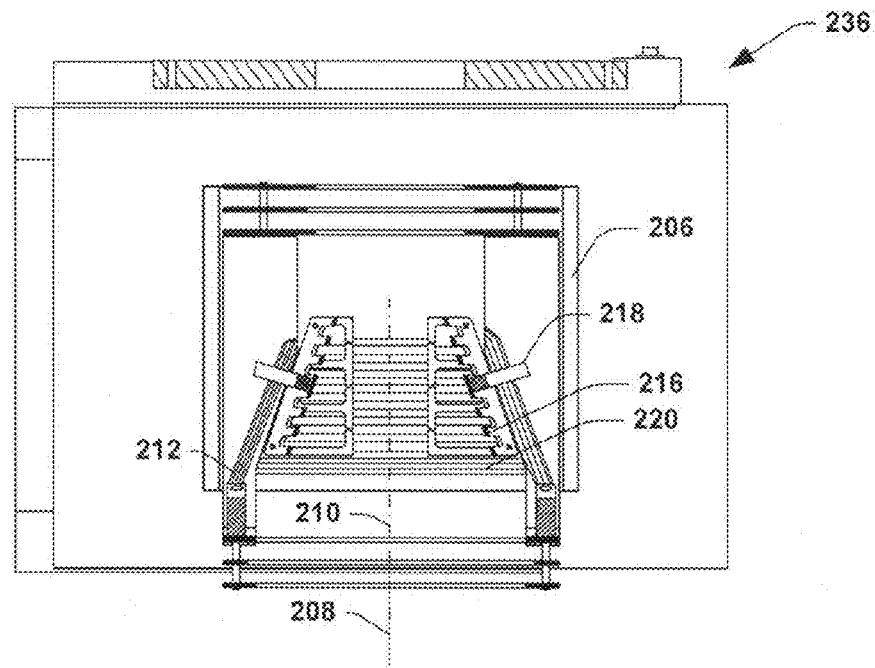
FIG. 2B illustrates an example of a frontal view of a hybrid scanner in accordance with one aspect of the disclosure.

FIG. 2B illustrates an example of a frontal view of a hybrid scanner 236 as illustrated in FIG. 2A comprising both electric and magnetic scanning components. FIG. 2B illustrates only lower portions of electric scanning components 216, which are described in more detail infra. The beam enters through aperture 206 along a longitudinal path 210 that transverses the inner chamber. Magnetic coils 212 can be wrapped around a yoke (not shown). The coils 212, in one example, can comprise a conductive wire that conducts current through the coils 212 to generate magnetic fields for a magnetic scanning mode.

The electric scanning components 216 can be slotted in structure to minimize detrimental effects of eddy currents on the magnetic field amplitude of the scanner and power dissipation. They can also be laminated in order to further integrate with the magnetic components and not interfere with magnetic scan operations. Connecting insulators 218 connect the electric scan components 216 to the scanner. The electric scanning components are further discussed in detail in the discussion infra of FIG. 6.

In the magnetic scanning mode, the beam 304 enters the scanner at an entrance aperture 306 and travels along path 302 where it is subject to magnetic fields that scan the beam sideways when a magnetic scanning mode is activated. Upon entering the aperture 306 the beam 304 can be a pencil beam, which is then scanned into a divergent ribbon beam 314 exiting on the other side through an exit aperture 308.

The exemplary scanner 236 illustrated comprises a pair of coils 212, oriented as an upper coil or pole piece (not shown) and lower coils 212, that together induce a magnetic field in an orientation that results in a magnetic field extending into and out of the page. The coils 212 of this exemplary scanner 236 are positioned around a yoke (not shown). The core can be laminated for an AC magnetic field to keep eddy current losses low and prevent the magnetic field induced by the coils from shorting, such as from diamagnetic effects. Similarly, components in between the coils can be laminated also, such as a liner 220, for example.

In one embodiment, the liner 220 can be substantially non-conductive in the same plane (horizontal x-z plane) as the coils in order to prevent any diamagnetic current flow, but conductive in other plane directions. The liner 220 can comprise an array of plates that surround the inside of the chamber, but are illustrated here as split at the cross section for illustration. The plates can function to protect the core (e.g., iron core) of the scanner which can also be laminated by a non-conductive laminate. The liner 316 further comprises at least one bar (not shown) to hold the plates together. For example, the plates can be held in a slotted arrangement such that each respective plate may be separated from one another with substantially equal distance there between. The bar can also hold at least one washer (not shown) for resting against the coil 220 and to further prevent interference with coils 212.

The magnetic field induced can be configured to deflect the ion beam 304 in a scan (x) direction at a vertex. As a result, the ion beam 304 oscillates in the scan direction as a scanned beam. The coils 220 illustrated and opposing upper coils (not shown) together can be electronically activated to carry an AC current, which thereby causes the (time-varying) magnetic field to be a dipole field oscillating in the plus vertical direction and negative vertical direction to bend the ion beam accordingly.

FIG. 3 illustrates a magnetic scanning assembly 300 of an exemplary hybrid scanner in accordance with the present disclosure. It is appreciated that hybrid scanners in accordance with the present disclosure can include magnetic scanning performed with alternate components and/or variations thereof. Electric scanning components are not shown in order to more fully illustrate the magnetic scanning.

FIG. 3 illustrates a cross-section of yokes within the magnetic assembly 300 as a pair of yokes, oriented as a yoke 350a and a lower yoke 350b, that together generate a magnetic field 302 (illustrated in an orientation that results in a magnetic field extending into and out of the page.) The cross-sectional yokes 350a, 350b of this exemplary assembly 300 comprise coils (not shown) around them. The magnetic field 302 is configured to deflect an ion beam 304 in a scan (x) direction at a vertex 306. As a result, the ion beam 304 oscillates in the scan direction as a scanned beam 308. The yokes 350a, 350b are electronically activated, and may include conductors, e.g., coils through which electrical current can flow. A power supply or other controllable power delivery device (not shown) may be operably coupled to the coils and configured to control the oscillation of the magnetic field and the diverting or fanning of the ion beam 306 in the scan direction. A controller 310 is operably coupled to the upper and lower yokes 350a, 350b and configured to control the delivery of power in order to produce the desired magnetic field 302. The magnetic scanning may be advantageously used for low energy ion beams, such as Boron ion beams with energy values below around 5 keV, for example.

Figure 4:
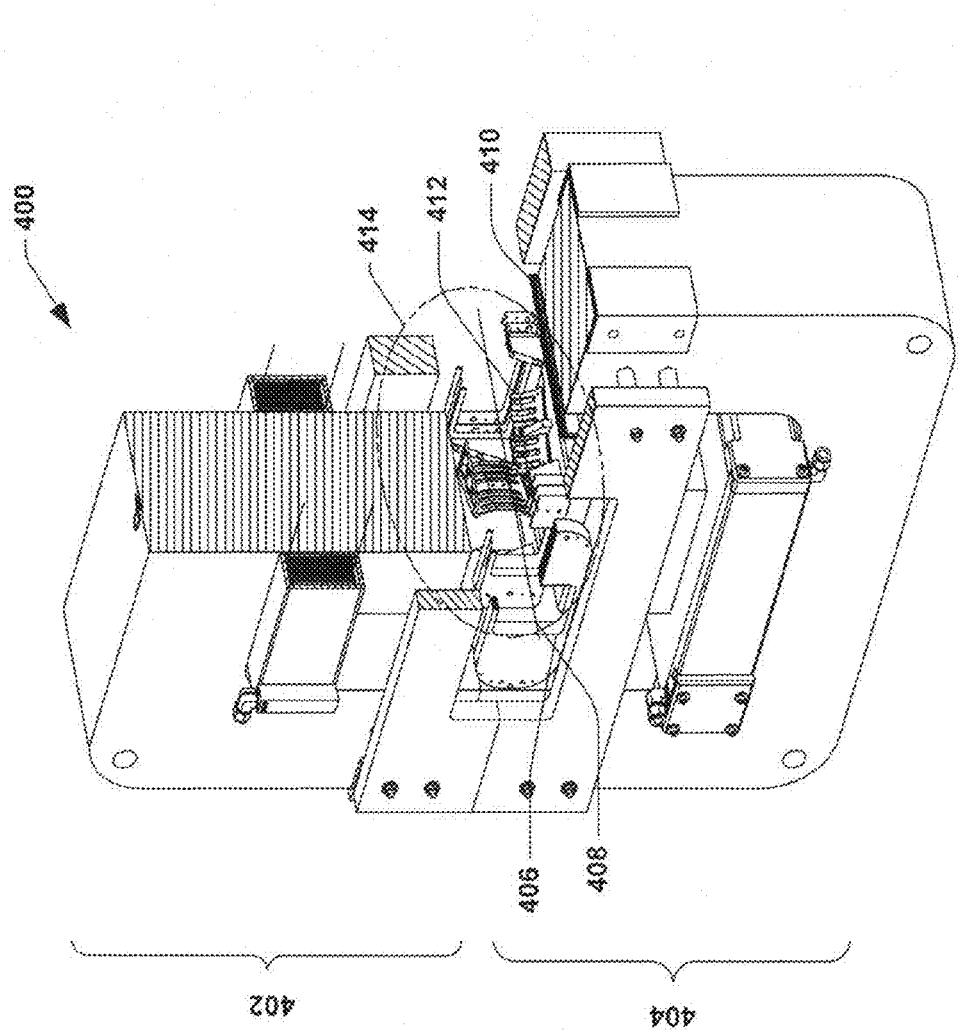
FIG. 4 illustrates a hybrid scanner for use in ion implantation systems.

FIG. 4 is a cut out diagram illustrating an exemplary hybrid scanner 400 capable of performing both electric and magnetic scanning of an ion beam, in accordance with the present disclosure. The hybrid scanner 400 is illustrated with a quarter section cut out (similar to a three-quarters section of the scanner in FIG. 2A) in order to more fully appreciate the components within. The hybrid scanner 400 can also comprise another example of the scanner 136 illustrated in FIG. 1. The scanner 400 comprises an upper half 402 and a lower half 404, which together form an aperture 406 for entrance of a beam 408. Once inside of a chamber region 414 the beam 408 can be scanned to provide a scanned beam (not shown), such as a scanned ribbon beam (i.e., a time-average ribbon that is a hybrid scan), a real-time static ribbon beam, or any other type of ribbon beams provided by various arrangements. Encompassed within the chamber region 414 can be a plurality of magnetic scanning components 410 (such as coils), as well as electric scanning components 412 therein. In addition, in one embodiment, the hybrid scanner could comprise a power control unit (not shown) that effectively controls power to both the electric scanning components and magnetic scanning components as will be discussed further infra.

Alternatively, in one embodiment, the beam can comprise other types of scan mechanisms that can be embodied herein, such as for solely a pencil beam. The beam may comprise any number of beam types including, but not limited to, a standard beam line with an end station after the mass analyzer without any scanning type mechanism. In this case, the power control unit (discussed infra) can effectively control power to both the electric scanning components and magnetic scanning components of the hybrid scanner 400 to allow for a pencil beam to enter the aperture 406 and exit there through.

Figure 5:
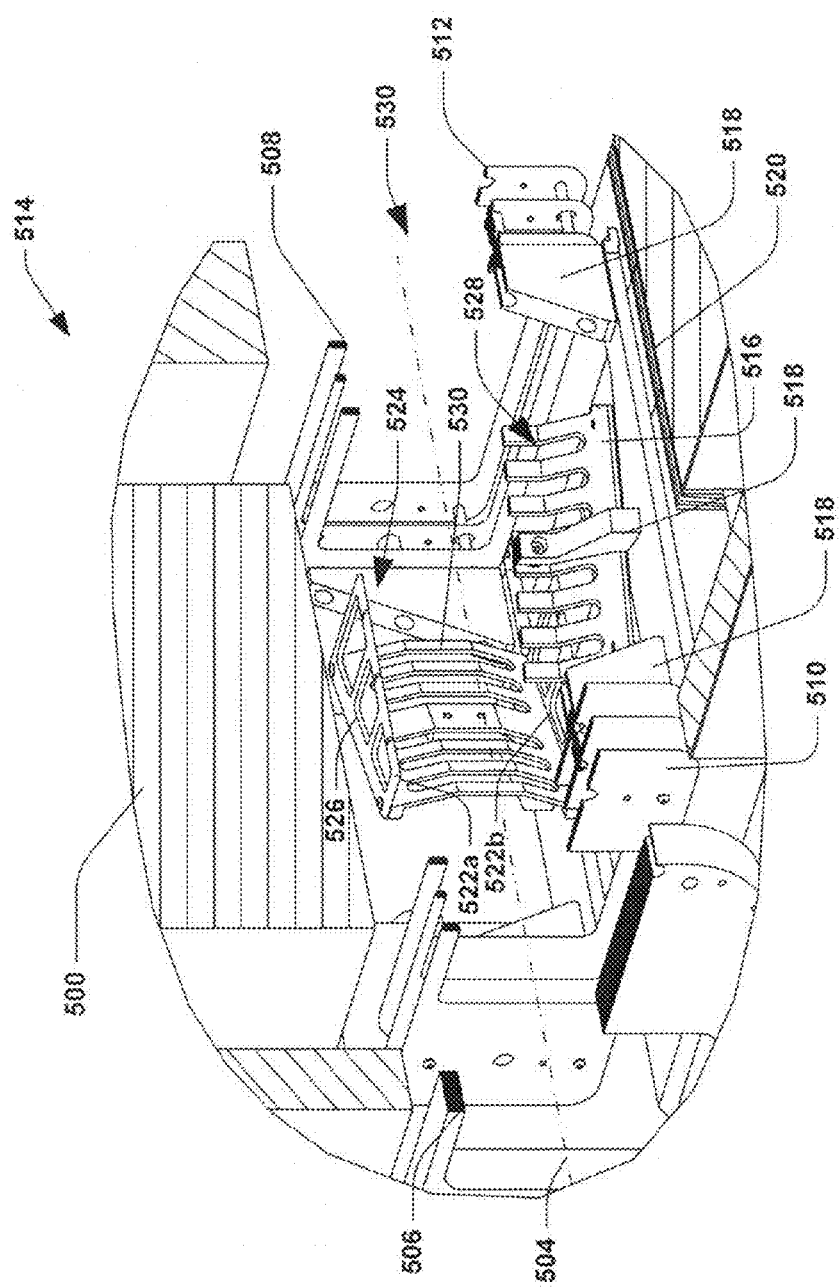
FIG. 5 illustrates another view of a hybrid scanner in accordance with an aspect of the disclosure.

Turning now to FIG. 5, a chamber region 514 of a hybrid scanner 500 is illustrated comprising electric scanning components integrated with magnetic scanning components. FIG. 5 is one embodiment of the inner chamber region 414 of FIG. 4 that demonstrates more particularly the electric scanning components. FIG. 5 is a three-quarters cross section of the chamber region 514 lying within the hybrid scanner that is integrated together with the magnetic scanning components.

An aperture 506 is configured to provide entrance to an ion beam (not shown) directed along an axis 504. The electric scanning components 508 comprise front plates 510 and back plates 512, as well as a middle pair of scan plates 516. The electric scanning components further comprise connecting insulators 518 connecting the plates 510, 512 and 516 thereon in a manner that does not perturb the magnetic field induced in a magnetic scanning mode by magnetic scanning components 520. Additionally, the electric scanning components can be laminated or slotted to minimize the effect of eddy currents in order to not perturb magnetic fields induced in magnetic scanning modes.

Electric scanning can be generated in an electric scanning mode by a pair of plates with an alternative electric field configured to steer the beam left and right. In one embodiment, the geometry of the scanning plates, however, can fit into the very confined magnetic scanning volume/chamber region 514 and has thus been designed as shown in FIG. 5 to allow for such integration without shorting out the electric scanning components. For example, the middle pair of scan plates 516 respectively comprises top portions 522a and bottom portions 522b forming a plurality of top and bottom loops 526 as illustrated. Additionally, to permit magnetic scanning the loops respectively comprise cuts or notches 524 therein so as to not form completed loops that otherwise can allow circulating diamagnetic currents opposing the magnetic fields of the magnetic scanning mode.

In one embodiment, the middle pair of scan plates 516 generates an electric field respectively through alternating currents that can form a ribbon beam therein and are thus flared outward in such a manner. The middle pair of scan plates 516 comprises vertical plates 530 as sidewalls between the top portions 522a and bottom portions 522b. The vertical plates 530 are additionally slotted to form a rib-piece structure of slots 528. The slots 528 allow the electric scanning components to physically integrate with the magnetic scanning components in a way that prevents interference there-between.

The top portions 522a and bottom portions 522b of the pair of scan plates 516 provide extensions respectively to the vertical plates 530 which are conductive and at the same potential as respective vertical plates 530. The top portions 522a and bottom portions 522b further provide shielding for the ground potential formed by the material and liner of the magnetic scanning components. In addition, these portions 522a and 522b have sufficient clearance from one another to cause electric breakdown of the clearance gaps to core portions of the magnet via arcing, and allow for integration of both the electric and magnetic scanning components.

In one embodiment, as illustrated in FIG. 5, the front plates 510 and back plates 512 can be taller than the pair of scan plates 516, e.g., for suppressing free electrons, and form entrance apertures 506 and exit apertures 530 respectively. The front plates 510 and back plates 512 respectively comprise a plurality of plates that operate as suppression assemblies. For example, the plurality of plates comprising the front plates 510 and back plates 512 can comprise three plates respectively. In one embodiment, the first and last plate can be grounded and the middle one biased negatively to repel free electrons. Consequently, the scan plates can be protected from energetic electrons, and thereby increasing their lifespan and efficiency can be achieved.

Figure 6:
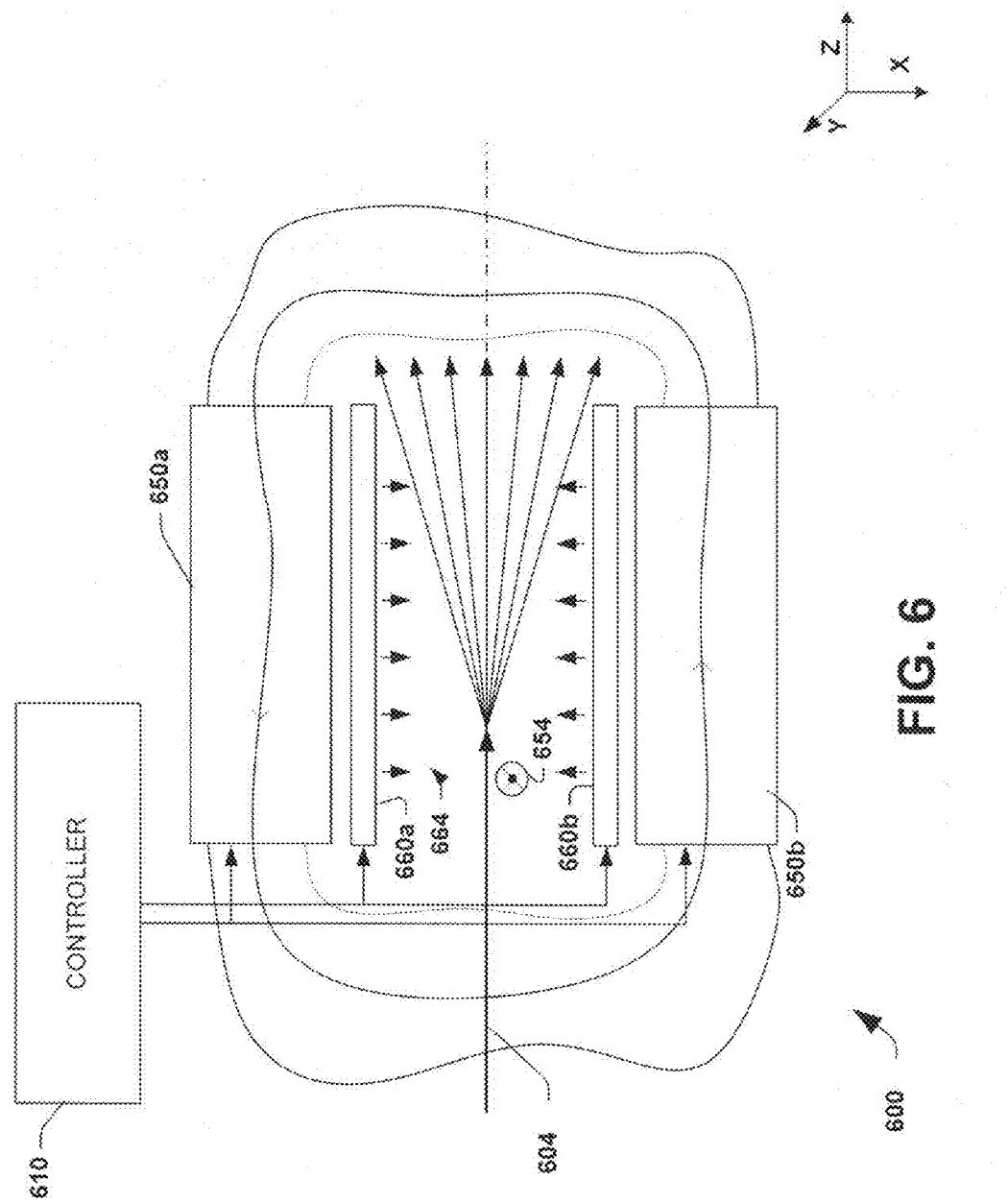
FIG. 6 illustrates a diagram of hybrid scanning in accordance with an aspect of the disclosure.

FIG. 6 is a diagram illustrating another exemplary hybrid scanner 600 capable of performing both electric and magnetic scanning of an ion beam, in a manner in accordance with the present disclosure. The electric scanning may be employed for low space-charge ion beams, such as ion beams having currents less than about 2 mA and about 5 keV beam energy for $^{11}B^+$ ions, whereas the magnetic scanning may be employed for high space-charge ion beams, such as ion beams having currents greater than about 2 mA and about 5 keV beam energy for $^{11}B^+$ ions, for example. Alternatively, both the electronic scanning and magnetic scanning can be employed concurrently.

The exemplary hybrid scanner 600 of FIG. 6 comprises a power delivery controller 610, a pair of magnetic elements 650a, 650b, and a pair of electric elements 660a, 660b. The power delivery controller 610 is operably coupled to the magnetic elements 650a, 650b and the electric elements 660a, 660b and includes, in this example, one or more controllable power supplies and control circuitry. The power delivery controller 610 is configured to provide a periodic voltage waveform to the electric elements 660a, 660b for electric scanning and an periodic current waveform to the magnetic elements 650a, 650b for magnetic scanning.

The magnetic elements 650a, 650b may comprise electromagnets, such as coils around a yoke, and may be configured to generate a magnetic field 654 proximate to the ion beam (illustrated in an orientation that results in a magnetic field extending into and out of the page.) The magnetic elements 650a, 650b may receive the periodic waveform from the power delivery controller 610 in order to generate the magnetic field 654.

The electric elements 660a, 660b comprise a plurality of electrodes configured to generate an electric field proximate the ion beam. The electric elements 660a, 660b may receive the periodic control waveform from the power delivery controller 610 in order to generate the electric field.

In some embodiments, including the exemplary ion implantation system 110 of FIG. 1, the control system 610 is configured to adjust the parameters of the ion implantation system in relation to one or more parameters of the ion beam. More particularly, the control system 610 may be configured to select one of the electric scanning mode and the magnetic scanning mode, in relation to one or more properties of the ion beam, including (for example) the ion beam energy, ion beam current, the dopant species, and the ion beam profile at a point in the beam path (e.g., at the end station, as measured by a dosimetry system.)

Alternatively, the control system 610 may accept input from a user of the system as to the selected scanning mode, and may accordingly control the hybrid scanner.

The control system 610 may be operably coupled with the hybrid scanner 136 and configured to receive input from and/or provide control output to the hybrid scanner 600. In one such embodiment, the control system 610 may be configured to control the hybrid scanner 600 by controlling the power supply for the hybrid scanner 600. The control system 610 may further be configured to communicate with, by receiving input from and/or providing control output to, one or more of the ion source 120, the mass analyzer 127, the focusing and steering element 138 (e.g., by communicating with the power supply 150 for the focusing and steering element 138), the parallelizer 139, the deceleration stage 157, and the dosimetry system 152, as illustrated in FIG. 1. The control system 610 may be configured to communicate with one or more of the aforementioned components in order to adjust ion beam properties in desired and/or advantageous ways. In one embodiment, the control system 610 may be configured to adjust the energy level of the ion beam and the resulting junction depths of the implanted dopant by adjusting the bias applied to electrodes in the ion extraction assembly 123 and the deceleration stage 157, as illustrated in FIG. 1. In another embodiment, the control system 610 may be configured to adjust the curvature of the path of the ion beam by controlling the strength and orientation of magnetic field(s) generated in the mass analyzer 126 can be adjusted, such as by regulating the amount of electrical current running through field windings therein. In yet another embodiment, the control system 610 may be configured to adjust the angle of implantation by controlling the voltage applied to the steering element 138 of FIG. 1.

In one embodiment, the control system may be operably coupled with a dosimetry system, and may select one of the electric scanning mode and the magnetic scanning mode in relation to at least one property of the ion beam measured by the dosimetry system, such as ion beam current, ion beam profile dimensions, and ion beam flux. The control system may utilize this information to select the scanning mode and to control the hybrid scanner, and optionally other components of the ion implantation system to which the control system is operably coupled, in order to facilitate uniformity of implantation. For example, the power delivery controller may adjust the rate of the scanning in one or more directions in order to expedite or slow down the scan across a portion of the workpiece and thereby adjust the magnitude of ion implantation in that portion of the workpiece.

During operation, the controller 610 selects one of the magnetic scanning mode and the electric scanning mode, which selection may be based upon ion beam characteristics such as (e.g.) beam energy, beam envelope (size and shape), desired beam current, and the like. As noted herein, due to some properties of the ion beam, the magnetic mode may be advantageously selected for scanning relatively high current, while the electric scanning mode may be advantageously selected for scanning lower energy ion beams.

When the magnetic scanning mode is selected, the power delivery controller 610 supplies power to the magnetic elements 650a, 650b, and withholds power from the electric elements 660a, 660b so as to not generate an electric field therebetween. As a result, the magnetic field 654 is generated and diverts the ion beam 604 along an x direction according a selected scanned beam width. A parallelizer (not shown) may be included that is configured to translate the scanned beam along a desired or selected path parallel to an axis toward a target workpiece.

In one embodiment, when the electric scanning mode is selected, the power deliver controller 610 supplies power to the electric elements 660a, 660b, and can withhold power from the magnetic elements 650a, 650b so as to not generate a magnetic field therebetween. As a result, the electric field 664 is generated and diverts the ion beam 604 along the x direction according to a selected scanned beam width. A parallelizer (not shown) may be included that is configured to translate the scanned beam along a desired or selected path parallel to an axis toward a target workpiece.

Figure 7:
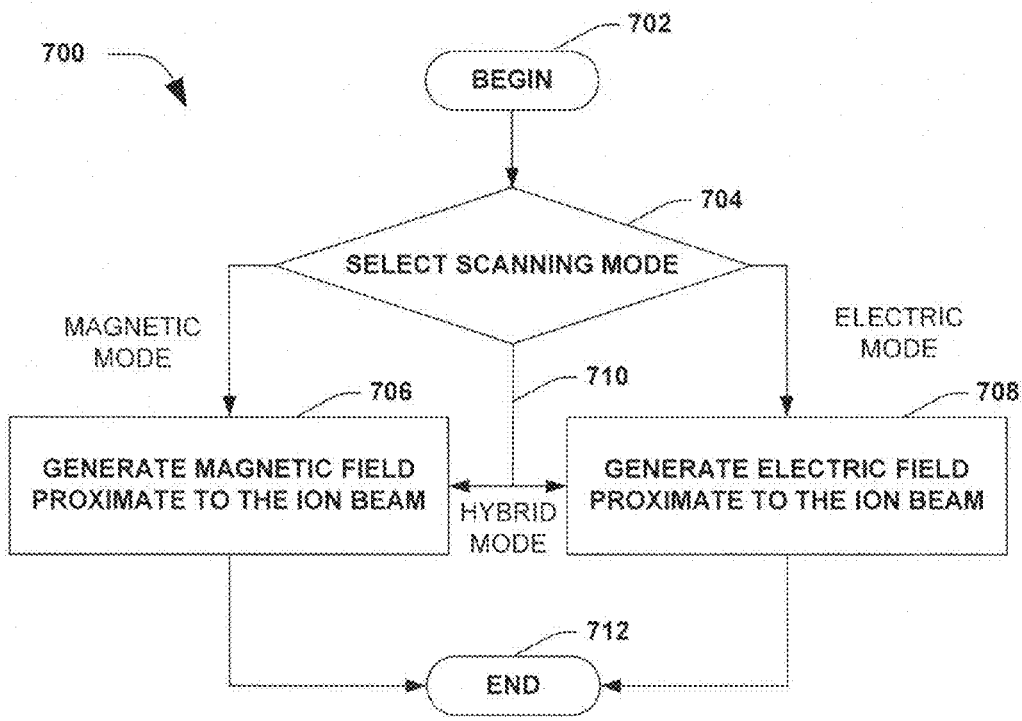
FIG. 7 is a flow diagram illustrating a method of operating a hybrid scanner.

FIG. 7 is a flow diagram illustrating a method 700 of operating a hybrid scanner in accordance with the present disclosure, which confers the benefits of magnetic and/or electric scanning for various ion beams. The above figures may be referenced for additional details and/or examples of a suitable hybrid scanner, but the method is not intended to be limited thereby. The method 700 begins at block 702, and involves selecting at least one of the available scanning modes (electric scanning mode or magnetic scanning mode) at 704. For example, a magnetic scanning mode, an electric scanning mode, or both a magnetic scanning mode and an electric scanning mode. If a magnetic scanning mode is selected, for example, the method continues at 706 by generating a magnetic field proximate to the ion beam. If the electric scanning mode is selected, the method continues at 708 by generating an electric field proximate to the ion beam. Alternatively, both the electric scanning mode and the magnetic scanning mode can be selected at 710. Alternatively, both the physical field at 706 and 708 can be generated concurrently. The generation of the physical field at 706 and/or 708 proximate to the ion beam therefore scans the ion beam in the selected manner, and so the method therefore ends at 712.

It will be appreciated that the method of scanning an ion beam 700 illustrated in FIG. 7 may be utilized in various manners to accomplish various ends. For example, the method 700 may be continuously performed to scan the ion beam across the workpiece, such as by adjusting the strength of the generated physical field to adjust the scanning of the ion beam across the workpiece. Also, as discussed herein, various ion beam properties, such as beam current and beam envelope can be continuously or intermittently monitored. The generated physical field may be adjusted, to account for measured variations or non-uniformities, or to vary the scanning in a desirable manner, such as by varying the power provided to the magnetic scanning elements and by varying the power provided to the electric scanning elements.

Although the disclosure has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. A system for implanting ions in a workpiece, comprising:
    an ion source configured to generate an ion beam;
    a mass analysis component configured to selectively filter the ions of the ion beam generated;
    a hybrid scanner configured to operate in one of a plurality of available scanning modes having different electromagnetic field characteristics, wherein the hybrid scanner is configured to generate solely a periodically varying magnetic scanning field across the ion beam for a magnetic scanning mode and generate solely a periodically varying electric scanning field across the ion beam for an electric scanning mode, wherein the hybrid scanner comprises at least one pair of scan plates configured to generate the periodically varying electric scanning field, and wherein the at least one pair of scan plates form a plurality of loops having cuts defined therein, thereby preventing circulating diamagnetic currents to flow while permitting magnetic scanning in the hybrid scanner; and
    an end station configured to support the workpiece in the path of the ion beam.

2. The system of claim 1, further comprising a controller configured to select one of the magnetic scanning mode and the electric scanning mode for scanning the ion beam based on at least one ion beam property.

3. The system of claim 2, wherein the at least one ion beam property comprises at least one of beam energy, current, voltage, mass, charge, and species of the ion beam.

4. The system of claim 3, wherein the magnetic scanning mode is selected for scanning ion beams having a beam energy below an energy threshold value.

5. The system of claim 4, wherein the energy threshold value is about 5 keV for $^{11}B^+$ ions and about 12 keV for $^{75}As^+$ ions.

6. The system of claim 1, wherein the hybrid scanner comprises a plurality of magnetic elements configured to generate the magnetic scanning field across the ion beam, and wherein at least one of the magnetic elements comprises a coil.

7. The system of claim 6, further comprising a magnetic scanner power supply configured to provide power to at least one of the magnetic elements.

8. The system of claim 1, wherein the hybrid scanner comprises a plurality of electric elements configured to generate the electric scanning field across the ion beam, and wherein at least one of the electric elements comprises a scan plate configured to integrate with components of the magnetic scanning mode in a way that prevents interference there-between.

9. The system of claim 8, further comprising an electric scanner power supply configured to provide power to at least one of the electric elements, and wherein the scan plate is slotted with top and bottom extensions for integration with components of the magnetic scanning mode.

10. The system of claim 2, further comprising a power delivery controller configured to provide power to scanning elements for at least one of the electric scanning mode and the magnetic scanning mode, and to withhold power from the scanning elements of any scanning mode not activated.

11. The system of claim 2, further comprising a control system operably coupled with the hybrid scanner and configured to select at least one of the electric scanning mode and the magnetic scanning mode in relation to at least one ion beam property.

12. A hybrid scanner for scanning an ion beam, comprising:
    a plurality of magnetic elements configured to generate a periodically varying magnetic field across the ion beam in a magnetic scanning mode;
    a plurality of electric elements configured to generate a periodically varying electric field across the ion beam in an electric scanning mode, wherein the plurality of electric elements comprise at least one pair of scan plates configured to generate the periodically varying electric field, and wherein the at least one pair of scan plates form a plurality of loops having cuts defined therein, thereby preventing circulating diamagnetic currents to flow while permitting magnetic scanning in the hybrid scanner; and
    a power delivery controller operably coupled to at least one of the magnetic elements and at least one of the electric elements and configured to:
        provide power to the at least one of the magnetic elements and to withhold power from the electric elements in the magnetic scanning mode; and
        provide power to the at least one of the electric elements and to withhold power from the magnetic elements in the electric scanning mode.

13. The scanner of claim 12, wherein at least one of the magnetic elements comprises a magnetic coil and wherein at least one of the electric scanning components comprises at least one scanning plate configured to integrate with the magnetic elements in a way that prevents interference there-between.

14. The scanner of claim 12, wherein the power delivery controller selects at least one of the scanning modes according to at least one ion beam property by selectively enabling one of the plurality of magnetic elements or the plurality of electric elements.

15. The scanner of claim 12, wherein the power delivery controller selects the magnetic scanning mode for scanning ion beams having a beam energy being below an energy threshold value by enabling the plurality of magnetic elements.

16. The scanner of claim 15, wherein the energy threshold value is about 10 keV.

17. A method of operating a hybrid scanner to scan an ion beam, the method comprising:
    selecting one of an electric scanning mode and a magnetic scanning mode, wherein both of the electric scanning mode and the magnetic scanning mode are available to be employed with the hybrid scanner;

on selecting the magnetic scanning mode, generating a periodically varying magnetic field across the ion beam; and on selecting the electric scanning mode, generating a periodically varying electric field across the ion beam, via a plurality of electric elements comprising at least one pair of scan plates, wherein the at least one pair of scan plates form a plurality of loops having cuts defined therein, thereby preventing circulating diamagnetic currents to flow while permitting magnetic scanning in the hybrid scanner;

providing power to scanning elements associated with the selected scanning mode and withholding power from scanning elements not associated with the selected scanning mode;

wherein providing power is performed by a power delivery controller operably coupled to at least one magnetic element and at least one of electric element and configured to provide power to the scanning elements associated with the selected scanning modes and to withhold power from scanning elements not associated with the selected scanning mode.

18. The method of claim 17, wherein at least one of the magnetic scanning mode and the electric scanning mode is selected for scanning the ion beam according to at least one ion beam property.

19. The method of claim 17, wherein the power delivery controller selects the magnetic scanning mode for scanning ion beams having a beam energy being below an energy threshold value.

20. The system of claim 1, wherein the hybrid scanner is further configured to generate both the magnetic scanning field and the electric scanning field across the ion beam for a hybrid scanning mode.

21. The scanner of claim 12, wherein the power delivery controller is further configured to provide power to the at least one of the electric elements and the at least one of the magnetic elements in a hybrid scanning mode comprising the magnetic scanning mode and the electric scanning mode.

22. The method of claim 17, further comprising selecting a hybrid scanning mode comprising the electric scanning mode and the magnetic scanning mode.

* * * * *